(12) United States Patent
Conger

(10) Patent No.: US 9,027,288 B2
(45) Date of Patent: May 12, 2015

(54) SOLAR ARRAY SYSTEM FOR COVERING A BODY OF WATER

(71) Applicant: P4P Holdings, LLC, Carbondale, CO (US)

(72) Inventor: Steven J. Conger, Carbondale, CO (US)

(73) Assignee: P4P Holdings, LLC, Carbondale, CO (US)

( * ) Notice: Subject to any disclaimer, the term of this patent is extended or adjusted under 35 U.S.C. 154(b) by 0 days.

(21) Appl. No.: 14/521,182

(22) Filed: Oct. 22, 2014

(65) Prior Publication Data

US 2015/0040968 A1    Feb. 12, 2015

Related U.S. Application Data

(63) Continuation of application No. 13/848,646, filed on Mar. 21, 2013, now Pat. No. 8,875,450, which is a continuation-in-part of application No. 12/817,063, filed on Jun. 16, 2010, now abandoned, which is a (Continued)

(51) Int. Cl.
*E04H 12/20* (2006.01)
*H02N 6/00* (2006.01)
*E04H 14/00* (2006.01)

(Continued)

(52) U.S. Cl.
CPC ............ *H01L 31/0422* (2013.01); *F24J 2/5241* (2013.01); *F24J 2/523* (2013.01)

(58) Field of Classification Search
USPC .......... 52/3, 4, 23, 146, 147, 148, 149, 173.3; 136/251
See application file for complete search history.

(56) References Cited

U.S. PATENT DOCUMENTS

| | | | |
|---|---|---|---|
| 2,808,913 | A | 10/1957 | Frieder et al. |
| 3,288,158 | A | 11/1966 | Gugliotta |

(Continued)

FOREIGN PATENT DOCUMENTS

| | | |
|---|---|---|
| CA | 2397850 | 2/2004 |
| DE | 3504133 | 8/1986 |

(Continued)

OTHER PUBLICATIONS

U.S. Appl. No. 14/523,592, filed Oct. 24, 2014, Conger.

(Continued)

*Primary Examiner* — Mark Wendell
*Assistant Examiner* — Keith Minter
(74) *Attorney, Agent, or Firm* — Sheridan Ross P.C.

(57) ABSTRACT

Systems and methods for supporting a solar panel array are disclosed, with embodiments specifically directed to spanning bodies of water such as aqueducts, canals, or other waterways. Cable truss assemblies are used to support panel receivers and solar panels mounted over the panel receivers. The cable truss assemblies are supported on groups of columns or other vertically extending support members anchored in the ground. Cable anchor lines may supplement anchoring and support of the installed solar panel array. Embodiments of the system include various combinations of supporting cables making up the cable truss assemblies. A method is also provided for construction of the solar panel array. Lengthy and continuous spans of the solar panel array can be installed over waterways by use of the cable truss assemblies. The solar panel arrays produce power, and simultaneously reduce evaporation from the waterways, resulting in conservation of water.

21 Claims, 13 Drawing Sheets

Related U.S. Application Data continuation-in-part of application No. 12/580,170, filed on Oct. 15, 2009, now Pat. No. 8,429,861, which is a continuation-in-part of application No. 12/466,331, filed on May 14, 2009, now Pat. No. 8,381,464, which is a continuation-in-part of application No. 12/255,178, filed on Oct. 21, 2008, now Pat. No. 8,212,140, which is a continuation-in-part of application No. 12/143,624, filed on Jun. 20, 2008, now Pat. No. 8,278,547, which is a continuation-in-part of application No. 12/122,228, filed on May 16, 2008, now abandoned, which is a continuation-in-part of application No. 11/856,521, filed on Sep. 17, 2007, now Pat. No. 7,687,706, which is a continuation of application No. 10/606,204, filed on Jun. 25, 2003, now Pat. No. 7,285,719.

(60) Provisional application No. 60/459,711, filed on Apr. 2, 2003.

(51) Int. Cl.
*F24J 2/52* (2006.01)
*H01L 31/042* (2014.01)

(56) References Cited

U.S. PATENT DOCUMENTS

| | | |
|---|---|---|
| 3,449,874 A | 6/1969 | Beaupre' |
| 3,550,140 A | 12/1970 | Werner |
| 3,588,904 A | 6/1971 | Broyles |
| 3,704,560 A | 12/1972 | Ratliff, Jr. |
| 3,750,349 A | 8/1973 | Deike |
| 3,783,573 A | 1/1974 | Vaughan |
| 4,025,786 A | 5/1977 | Hamilton |
| 4,063,963 A | 12/1977 | Bond, Jr. |
| 4,071,017 A | 1/1978 | Russell, Jr. et al. |
| 4,076,015 A | 2/1978 | Mattson |
| 4,119,863 A | 10/1978 | Kelly |
| 4,122,675 A | 10/1978 | Polyak |
| 4,135,493 A | 1/1979 | Kennedy |
| 4,186,720 A | 2/1980 | Schmauder et al. |
| 4,216,762 A | 8/1980 | Klaila |
| 4,245,616 A | 1/1981 | Wyland |
| 4,245,895 A | 1/1981 | Wildenrotter |
| 4,269,173 A | 5/1981 | Krueger et al. |
| D260,679 S | 9/1981 | Mayerovitch |
| 4,326,773 A | 4/1982 | Colas |
| 4,380,996 A | 4/1983 | Mengeringhausen |
| 4,385,918 A | 5/1983 | Dippel |
| 4,386,600 A | 6/1983 | Eggert, Jr. |
| 4,415,759 A | 11/1983 | Copeland et al. |
| 4,429,178 A | 1/1984 | Prideaux et al. |
| 4,449,347 A | 5/1984 | Rooney |
| 4,457,035 A | 7/1984 | Habegger et al. |
| 4,485,264 A | 11/1984 | Izu et al. |
| 4,487,989 A | 12/1984 | Wakefield et al. |
| 4,551,631 A | 11/1985 | Trigilio |
| 4,574,535 A | 3/1986 | Pabsch |
| 4,587,951 A | 5/1986 | Townsend |
| 4,602,613 A | 7/1986 | Barr |
| D285,829 S | 9/1986 | Lock |
| 4,632,340 A | 12/1986 | Duea |
| 4,656,996 A | 4/1987 | Aharon |
| 4,721,412 A | 1/1988 | King et al. |
| 4,832,001 A | 5/1989 | Baer |
| 4,835,918 A | 6/1989 | Dippel |
| D303,244 S | 9/1989 | Hanak |
| D311,722 S | 10/1990 | Cheng |
| 5,058,565 A | 10/1991 | Gee et al. |
| 5,069,540 A | 12/1991 | Gonder |
| 5,125,608 A | 6/1992 | McMaster et al. |
| 5,176,758 A | 1/1993 | Nath et al. |
| 5,212,916 A | 5/1993 | Dippel et al. |
| 5,236,378 A | 8/1993 | Newman |
| 5,347,402 A | 9/1994 | Arbogast |
| D353,129 S | 12/1994 | Ricaud et al. |
| 5,478,407 A | 12/1995 | Dorison et al. |
| 5,524,401 A | 6/1996 | Ishikawa et al. |
| D380,191 S | 6/1997 | White |
| 5,769,068 A | 6/1998 | Takahashi |
| D408,554 S | 4/1999 | Dinwoodie |
| 5,937,849 A | 8/1999 | Myles, III et al. |
| 5,961,099 A | 10/1999 | Thommen, Jr. |
| D425,013 S | 5/2000 | Lai |
| 6,063,996 A | 5/2000 | Takada et al. |
| 6,091,016 A | 7/2000 | Kester |
| 6,105,316 A | 8/2000 | Bottger et al. |
| 6,131,363 A | 10/2000 | Phillips |
| D442,139 S | 5/2001 | Sasaoka |
| RE37,498 E | 1/2002 | Thomas |
| 6,337,436 B1 | 1/2002 | Ganz |
| 6,397,869 B1 | 6/2002 | Jennings |
| 6,443,145 B1 | 9/2002 | Buron et al. |
| D469,399 S | 1/2003 | Shugar |
| 6,563,040 B2 | 5/2003 | Hayden et al. |
| D475,320 S | 6/2003 | Hensley et al. |
| 6,930,237 B2 | 8/2005 | Mattiuzzo |
| D511,576 S | 11/2005 | Shingleton et al. |
| 7,285,719 B2 | 10/2007 | Conger |
| D560,605 S | 1/2008 | McClintock et al. |
| D560,606 S | 1/2008 | McClintock et al. |
| 7,325,543 B2 | 2/2008 | Momii et al. |
| D564,443 S | 3/2008 | Moore |
| D584,223 S | 1/2009 | Cooper |
| 7,557,292 B2 | 7/2009 | Shingleton et al. |
| D605,585 S | 12/2009 | Conger |
| 7,687,706 B2 | 3/2010 | Conger |
| D625,250 S | 10/2010 | Conger |
| 7,847,185 B2 | 12/2010 | Schwarze |
| 7,851,935 B2 | 12/2010 | Tsao |
| 7,866,035 B2 | 1/2011 | Cummings et al. |
| D633,033 S | 2/2011 | Conger |
| 7,909,567 B2 | 3/2011 | Fein et al. |
| D648,269 S | 11/2011 | Conger |
| D649,112 S | 11/2011 | Conger |
| D655,672 S | 3/2012 | Conger |
| D657,737 S | 4/2012 | Mackler |
| 8,212,140 B2 | 7/2012 | Conger |
| 8,217,526 B2 | 7/2012 | Devitt |
| D664,916 S | 8/2012 | Conger |
| D665,731 S | 8/2012 | Conger |
| D669,846 S | 10/2012 | Conger |
| 8,278,547 B2 | 10/2012 | Conger |
| 8,381,464 B2 | 2/2013 | Conger |
| D679,242 S | 4/2013 | Conger |
| 8,429,861 B2 | 4/2013 | Conger et al. |
| 8,519,257 B2 | 8/2013 | Conger et al. |
| 8,875,450 B2 | 11/2014 | Conger |
| 2002/0182946 A1 | 12/2002 | Tanaka |
| 2005/0091916 A1 | 5/2005 | Faris |
| 2005/0126621 A1 | 6/2005 | Dinwoodie et al. |
| 2005/0141153 A1 | 6/2005 | Mucci et al. |
| 2006/0071862 A1 | 4/2006 | Aisenbrey |
| 2006/0233635 A1 | 10/2006 | Selsam |
| 2008/0047546 A1 | 2/2008 | Cummings |
| 2008/0057776 A1 | 3/2008 | Cummings |
| 2008/0168981 A1 | 7/2008 | Cummings et al. |
| 2008/0283112 A1 | 11/2008 | Conger |
| 2009/0184223 A1 | 7/2009 | Schwarze et al. |
| 2009/0200808 A1 | 8/2009 | Parmley |
| 2009/0211625 A1 | 8/2009 | Schwarze |
| 2009/0244890 A1 | 10/2009 | Pelken et al. |
| 2010/0038507 A1 | 2/2010 | Schwarze et al. |
| 2010/0051083 A1 | 3/2010 | Boyk |
| 2010/0095609 A1 | 4/2010 | Kim |
| 2010/0183443 A1 | 7/2010 | Thorne |
| 2010/0212654 A1 | 8/2010 | Trevijano |
| 2010/0251618 A1 | 10/2010 | Nishikawa et al. |
| 2010/0314509 A1 | 12/2010 | Conger |
| 2011/0089698 A1 | 4/2011 | Ahmadi |
| 2011/0113705 A1 | 5/2011 | Raczkowski |
| 2011/0197418 A1 | 8/2011 | Overturf et al. |

(56) References Cited

U.S. PATENT DOCUMENTS

| 2011/0221203 | A1 | 9/2011 | Miller |
| 2011/0277809 | A1 | 11/2011 | Dalland et al. |
| 2012/0192514 | A1 | 8/2012 | Farb et al. |
| 2012/0216855 | A1 | 8/2012 | Conger |
| 2012/0298180 | A1 | 11/2012 | Ratti et al. |
| 2013/0220397 | A1 | 8/2013 | Conger |
| 2014/0290155 | A1 | 10/2014 | Conger |

FOREIGN PATENT DOCUMENTS

| DE | 3643487 | 6/1988 |
| DE | 4038646 | 6/1992 |
| DE | 10050021 | 4/2001 |
| DE | 10116783 | 10/2002 |
| EP | 0373234 | 6/1990 |
| EP | 2256431 | 12/2010 |
| EP | 2261577 | 12/2010 |
| JP | 10-266499 | 10/1998 |
| JP | 2004-71805 | 9/2005 |
| WO | WO 2005/085633 | 9/2005 |
| WO | WO 2008/141813 | 11/2008 |
| WO | WO 2009/065377 | 5/2009 |
| WO | WO 2012/045129 | 4/2012 |

OTHER PUBLICATIONS

U.S. Appl. No. 29/318,811, filed May 13, 2008, Conger.
Baumgartner et al. "Solar Wings a New Lightweight PV Tracking System", 23re Eu PVSEC, Valencia, Sep. 4, 2008, invited talk 4DO.9.5.
Berger "Structural Form in Architecture: Part 3—From Tents to Tensile Architecture," Structure Magazine, Mar. 2008, pp. 38-41.
"Coolearth technology" coolearth, available at http://www.coolearthsolar.com/technology, printed May 23, 2008, p. 1-2.
Definition of "column," http://www.thefreedictionary.com/p/column, printed Dec. 14, 2010, 4 pages.
Difference between shear connection and moment connections, http://wiki.answers.com/Q/Difference_between_shear_connection_and_moment_connections, printed Dec. 14, 2010, 1 page.
Definition of "moment connection," http://mbmisteelbuildings.com/metal-building-terms#m, printed Dec. 19, 2010, 1 page.
Definition of "moment," http://www.thefreedictionary.com/p/moment, printed Dec. 19, 2010, 4 pages.
"Sharp Provides Solar Panels for Winery's "Floatovoltaic" Solar Array", available at http://solarbuss.com/News/NewsNAPR1099.htm, dated May 29, 2008 (accessed Jun. 23, 2008), pp. 1-2.
Foster + Partners "Hearst Headquarters", available at http://www.fosterandpartners.com/Projects/1124/Default.aspx, printerd Aug. 5, 2008, 11 pages.
Solyndra web pages available at http://ww.solyndra.com, printed May 11, 2009, 7 pages.
"Single Axis SunPower T20 Trackers", as early as Jul. 2007, 5 pages.
Solon Hilber—Malaga/Spain, available at http://www.solonhilber.at, translated by Google translate, available as early as Sep. 21, 2007, printed Mar. 23, 2010, 7 pages.
Tyler "Suspension Domes: Lateral stabilising cables," suspensiondomes.com (Found at: http://suspensiondomes.com/essays/lateral_cables/, waybackmachine, Apr. 27, 2007) 4 pages.
Examination Report for European Patent Application No. 04759693.7-1528, dated Apr. 27, 2007.
International Search Report for International (PCT) Patent Application No. PCT/US2004/008509, dated Oct. 22, 2004.
Written Opinion for International (PCT) Patent Application No. PCT/US2004/008509, mailed Oct. 22, 2004.
International Preliminary Report on Patentability for International (PCT) Patent Application No. PCT/US2004/008509, dated Oct. 14, 2005.
International Search Report for International (PCT) Patent Application No. PCT/US08/71414, dated Sep. 26, 2008.
Written Opinion for International (PCT) Patent Application No. PCT/US08/71414, dated Sep. 26, 2008.
International Search Report for International (PCT) Patent Application No. PCT/US09/44060, mailed Jun. 24, 2009.
Written Opinion for International (PCT) Patent Application No. PCT/US09/44060, mailed Jun. 24, 2009.
International Preliminary Report on Patentability for International (PCT) Patent Application No. PCT/US2008/071414, mailed Nov. 25, 2010.
International Preliminary Report on Patentability for International (PCT) Patent Application No. PCT/US2009/044060, mailed Nov. 25, 2010.
Extended Search Report for European Patent Application No. 09747645.1, dated Mar. 25, 2013 5 pages.
International Search Report and Written Opinion for International (PCT) Patent Application No. PCT/US2014/030968, mailed Aug. 19, 2014 11 pages.

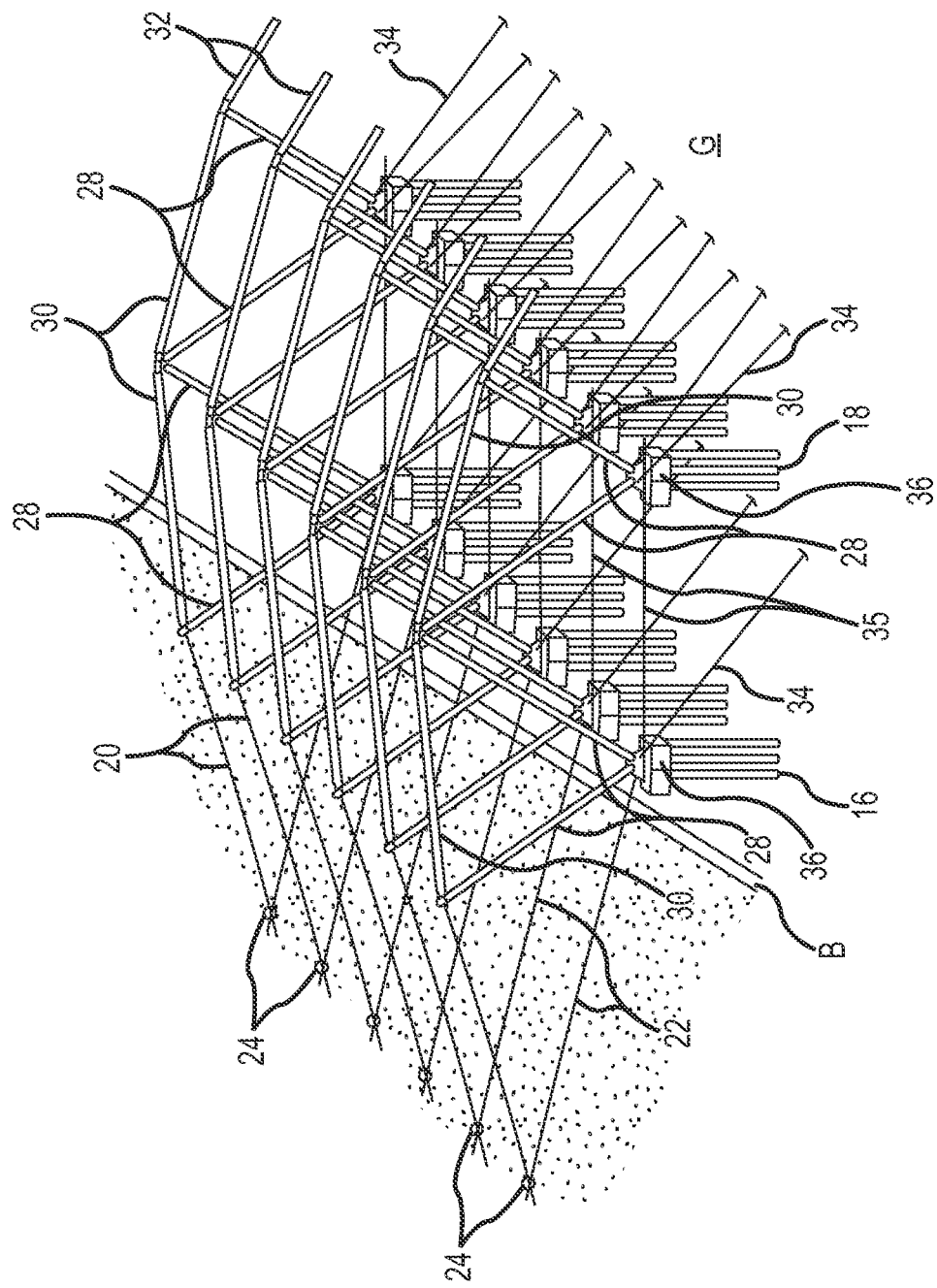

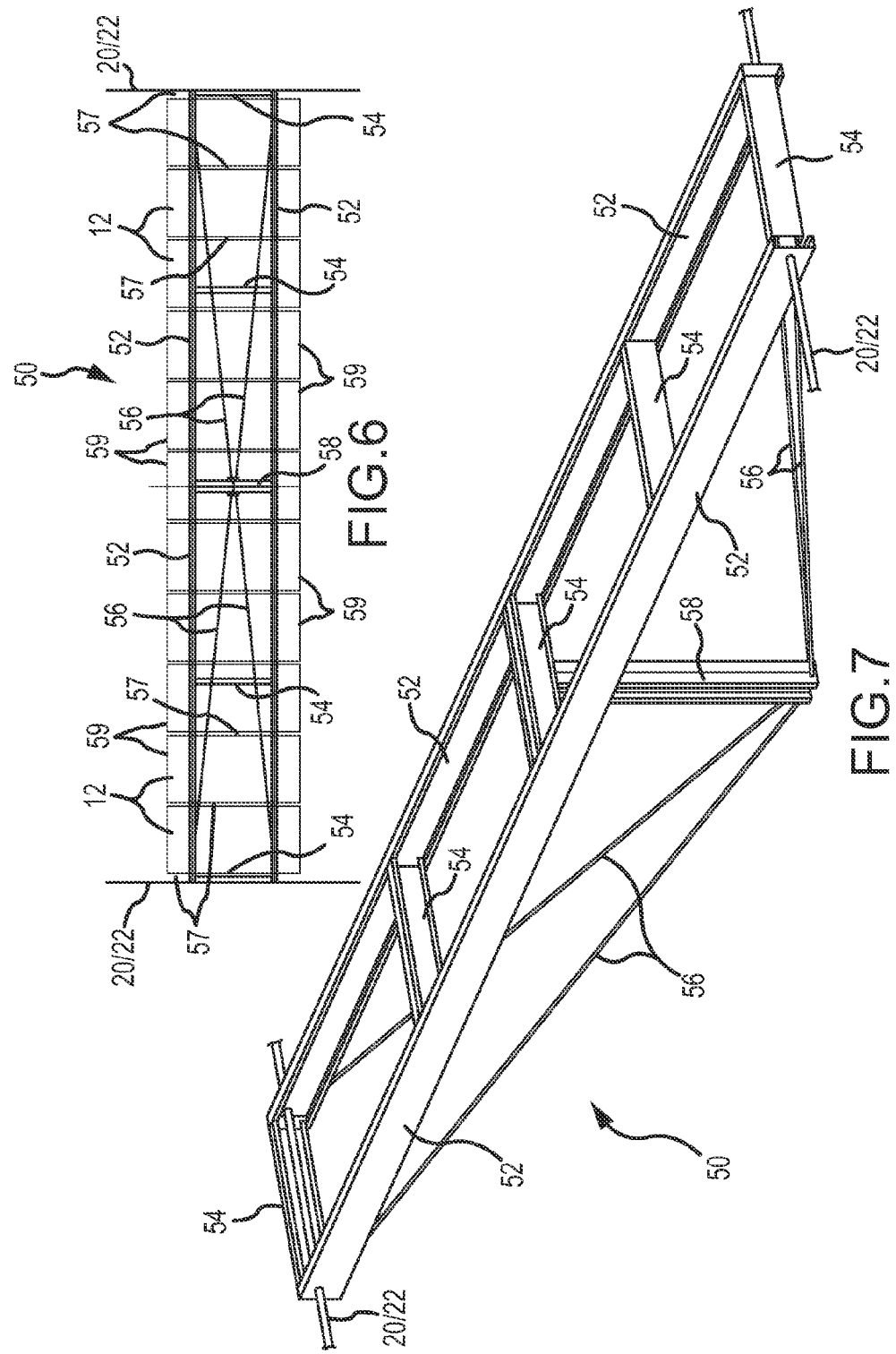

SOLAR ARRAY SYSTEM FOR COVERING A BODY OF WATER

CROSS REFERENCE TO RELATED APPLICATIONS

This application is a continuation of U.S. application Ser. No. 13/848,646, filed on Mar. 21, 2013, which is a continuation-in-part of U.S. application Ser. No. 12/817,063, filed on Jun. 16, 2010, which is a continuation-in-part of U.S. application Ser. No. 12/580,170, filed on Oct. 15, 2009, now U.S. Pat. No. 8,429,861, which is a continuation-in-part application of U.S. application Ser. No. 12/466,331, filed on May 14, 2009, now U.S. Pat. No. 8,381,464, which is a continuation-in-part application of U.S. application Ser. No. 12/255,178, filed on Oct. 21, 2008, now U.S. Pat. No. 8,212,140, which is a continuation-in-part application of U.S. application Ser. No. 12/143,624, filed on Jun. 20, 2008, now U.S. Pat. No. 8,278,547, which is a continuation-in-part application of U.S. application Ser. No. 12/122,228, filed on May 16, 2008, which is a continuation-in-part of U.S. application Ser. No. 11/856,521, filed on Sep. 17, 2007, now U.S. Pat. No. 7,687,706, which is a continuation application of U.S. application Ser. No. 10/606,204, filed Jun. 25, 2003, now U.S. Pat. No. 7,285,719, which claims priority from Provisional Application Ser. No. 60/459,711, filed Apr. 2, 2003, each prior application being incorporated herein by reference.

FIELD OF THE INVENTION

The present invention relates to solar panels and methods of using support structures to employ solar panels in large arrays, and more particularly, to solar panel arrays that can be used to simultaneously capture solar energy for producing power and for solar panels incorporated within arrays that cover a body of water to reduce evaporation thereby conserving water.

BACKGROUND OF THE INVENTION

Water as a natural resource continues to become a more scarce resource, particularly in many developing countries. Climate change, coupled with increased population has resulted in an increased demand for usable water supplies. In some areas, upstream water flows have been reduced by dams and other water diverting structures, thereby reducing available flow for downstream users.

Despite improvements in many technologies, most managed waterways such as canals or aqueducts do not have effective means to prevent evaporation loss. It is known to provide a lining to prevent water absorption into the ground, and many such canals and aqueducts may have some type of lining to limit water loss through absorption. However, for both large and small waterways, the amount of water lost by evaporation is significant, and linings do not prevent evaporation losses. Because of the cost involved with physically covering managed waterways, most waterways are un-covered.

Another problem in many developing countries is the lack of affordable and reliable electrical power. As urban areas continue to increase in size, electrical power requirements often exceed electrical power producing infrastructure. Even in what could be considered second world countries, many urban and rural areas have limited electrical power supplies that are rationed on a daily basis.

As an alternative to traditional fossil fuel energy sources, solar power has been developed in recent decades. Solar panels typically employ photovoltaics (PV) for generating electrical power by converting solar radiation into direct current electricity, as well known with respect to semiconductors that achieve a photovoltaic effect. However, although there are increasing needs for the use of solar power as an alternative to fossil fuels, one limiting factor in use of solar panels is the amount of land available to install the panels. Although photovoltaic technology has greatly improved, large arrays of solar panels are still required in order to produce comparable amounts of electricity to compensate for the lack of or loss of fossil fuel resources. In many developing countries, flat terrain near roads and other infrastructure may be very valuable as farmland and therefore not available to accommodate large groups of solar arrays. Additionally, there may be limited tracts of land available for purchase or lease to employ solar arrays, even in many developing countries. Large tracts of land are generally unavailable in most urban areas. Land in rural areas is difficult to purchase or lease in large tracts, and even if the requisite tracts of land could be made available, the cost to secure the land presents yet another obstacle in installing large groups of solar arrays.

Providing solar panels that cover bodies of water such as canals or aqueducts can provide an integrated solution for prevention of evaporation loss and as solution for available space for installing large groups of solar arrays. The production of electrical power coupled with the reduction in loss of water by evaporation provides two substantial benefits.

In many developing countries, one of the main requirements for electrical power is for pumping water for agricultural irrigation. Because of limited electrical power capabilities in many regions, the requirement for pumping coupled with an unexpected increase for electrical power within the same grid can result in intermittent power shortages and often stoppage of power for unpredictable time periods until the grid can recover. By providing an additional power source from solar arrays installed over selected lengths of a canal, the solar arrays can provide distributed energy for grids that may be particularly vulnerable to intermittent electrical power transmissions. This distributed energy that can be controlled with smart power grid strategies such as providing solar inverters programmed to provide variable outputs as the power requirements change in the grid. Thus, the grid can be supplemented with power from the solar panels to mitigate intermittent power transmission from power sources within the grid and thereby reducing the stress on the grid. The stabilizing of electrical power generated to the grid by the solar panels also effectively reduces the overall cost of solar power as compared to traditional fossil fuel power sources.

Most solar panel support structures incorporate heavy, rigid steel support members, and these types of installations therefore can be prohibitively expensive for large solar arrays due to the expense of installing the support structures that incorporate such great numbers of structural members. Other types of solar panel support structures may reduce the number of structural members, but these structures may not be adequately designed to withstand live loading conditions for large solar arrays. Therefore, there is a need to provide a robust, yet economical solar panel support structure that can be installed over extended lengths, such as over long distances of a water canal/aqueduct to produce enough power and corresponding revenue to compensate for the cost of installation, and to make the installation feasible for reaping the benefits of the conservation of water by reducing evaporation in those areas where the solar arrays are installed. There is also a need to provide a solar panel support structure design in which the structure can be easily installed, even on sloping terrain and other locations which traditionally are not suitable for installation of solar panels. There is yet a further need to provide a solar panel support structure design that does not inhibit or otherwise interfere with full operation of the canal/aqueduct such that the canal/aqueduct can undergo necessary maintenance or upgrade, and further wherein the solar panel support structure does not inhibit use of the canal/aqueduct as a navigable waterway.

SUMMARY OF THE INVENTION

The present invention provides solar panel arrays that are used to simultaneously capture solar energy for producing power and for solar panels incorporated within arrays that cover a body of water to reduce evaporation thereby conserving water. In one preferred embodiment of the invention, it includes a solar panel array installed over a body of water, such as a canal or aqueduct. The underlying support structure for supporting the solar panels can be generally characterized as a cable truss construction that spans the body of water, and is anchored on opposite sides of the body of water by columns and cable tie downs or anchors. Canals/aqueducts typically have generally parallel extending opposing banks. This geometry of this type of waterway facilitates installation of very large solar panel arrays with repeated truss structures spaced longitudinally from one another along the length of the arrays.

Each of the trusses includes a plurality of supporting members that provide a continuous supporting frame to support mounting of a plurality of solar panels. Direct support for the solar panels is provided by a plurality of panel receivers or pods that are mounted to the corresponding trusses. The particular arrangement of the members of the cable trusses including both tension and compression members provides for a very light, yet structurally robust construction that can withstand significant loading conditions. Particularly for long, continuous spans of a solar array, wind loads can present significant problems, and the solar array must therefore be able to withstand significant wind loading conditions. The present invention provides a solution to withstand difficult loading conditions, yet with a design that is economical and easy to install.

According to one preferred embodiment, the solar panel array is characterized by a plurality of spaced cable truss assemblies that provide support for a plurality of panel receivers/pods. Each of the panel receivers has mounted thereon a plurality of solar panels. The cable truss assemblies are supported on opposite sides or banks of the body of water by a plurality of vertical supports, including an interior set of columns and an exterior set of columns on each side of the body of water. Each of the cable truss assemblies can be defined as including first and second support cables, and a plurality of compression members that are arranged vertically to interconnect the support cables, and traverse a portion of the span of the truss in an alternating diagonal fashion. The first and second support cables are arranged such that the first cable can be generally described as having a convex curvature when viewed from a side elevation, and the second support cable can be generally described as having a concave curvature when viewed from the side elevation. Further, the first and second cables cross or intersect one another at two points along the span of the truss/width of the array such that the central area between the intersection points has a generally elliptical shaped cross sectional area in which the compression members are installed. The portions of the first and second cables that extend beyond the central area diverge from one another, thereby creating two generally triangular shaped cross sectional areas on opposite lateral sides of the span of the truss. The first and second support cables are connected to support structures on opposite banks or surfaces of the ground adjacent the body of water. In this first embodiment, the first support cables are secured to extension support assemblies that are mounted to the interior and exterior columns, and extend vertically above the columns. The second support cables may be secured directly to the interior and exterior columns.

With this particular configuration of the cables, compression members, columns, and extension support assemblies, the array provides for three generally convex areas for mounting of the solar panels: one larger center area and two lateral or side areas. The lateral edges of the array may include cantilevered supports that serve to increase the overall area available for mounting of the solar panels along the lateral side edges.

In another aspect of the invention, a particular construction is provided for the panel receivers. According to one preferred embodiment for the panel receivers, it includes a pair of parallel spaced main struts, a plurality of strut stabilizers interconnecting the pair of main struts, and a centrally oriented center strut that extends perpendicularly from the main struts and strut stabilizers, and is mounted to one of the strut stabilizers. A plurality of cables is secured to the free or distal end of the center strut, and the cables are secured at their opposite ends to respective corners of the panel receiver that is defined by the ends of the two main struts. Each of the panel receivers extends between adjacent cable truss assemblies and is secured to the respective upper cables of the truss assemblies. Accordingly, opposite ends of a panel receiver are supported by adjacent first or second support cables, and the panel receivers therefore provide additional structural stability to the solar panel array as a whole.

In one preferred embodiment, the extension support assemblies include a pair of vertically extending extension supports that extend above the column to which the extension supports are mounted, and the extension supports are disposed in a generally V shaped configuration with an upper lateral support interconnecting the upper free ends of the extension supports. Additional support is provided to the array by a plurality of anchor cables that are secured to the columns and/or secured to selected other support members.

With the above described solar panel array, the underlying support structure is capable of spanning a great number of solar panels over a significant length and width of a body of water. The overall design is aerodynamically sound and is able to withstand significant wind loading conditions. The combination of both rigid and flexible structural support members provides the necessary rigidity to support the solar panels, but is significantly lighter than traditional rigid solar panel support structures.

In yet another aspect of the invention, the lateral or side edges of the solar array serve as airfoils that can be used to selectively direct airflow in order to equalize or otherwise adjust air pressures above and beneath the array to handle wind loads. Further, the particular spacing between each panel receiver can be adjusted to accommodate the desired air pressure controls, as well as to adjust the amount of sunlight that is capable of passing through the array. For example, it may be desirable to design the center area of the array with smaller gaps between solar panel receivers to prevent evaporation; however, it may be desirable to provide larger gaps between the solar panel receivers along the lateral edges of the array in order to provide adequate sunlight for growth of vegetation. Each of the panel receivers may incorporate flexible gaskets that provide many functional benefits. The gaskets can be used to stabilize mounting of the solar panels on the receivers, as well as to provide cushioning with respect to torsional forces that may be induced upon the panel receivers during use. Further, the gaskets can be used to selectively adjust the size of gaps between adjacent panel receivers for control of air pressures and available sunlight. Additionally, the gaskets can be used to reduce, or virtually eliminate water loss to evaporation when combined with waterproof barriers of fabric supported by the column structures.

Therefore, in yet another embodiment of the invention, it is also contemplated that a waterproof barrier can be incorporated with the solar array to reduce or otherwise control evaporative losses. The barrier can be suspended from and supported by the cable truss assemblies and anchored at each side of the body of water by the respective column structures.

In another embodiment of the invention, in lieu of providing a plurality of interior columns and a plurality of exterior columns, the extension support assemblies may be directly mounted directly mounted to the ground, or to a foundation structure that minimally extends above the ground. Depending upon the clearance that is necessary under the solar array, columns can be used to provide the necessary clearance, or the extension support assemblies can be mounted directly to the ground. For larger canals which typically accommodate a high volume of watercraft traffic, it may be necessary to extend the height of the solar panel array in order to provide the necessary clearance. For all of the embodiments, subsurface supports are installed to provide adequate anchoring, to include piles, soil anchors, and the like.

In yet another embodiment of the invention, the solar panel array may be supported in a different configuration of columns, cables, and ground supports in which the solar panels are supported in a convex configuration with a plurality of upper tensioning cables that are secured to upper ends of the columns. More specifically, each of the columns supports a plurality of upper tensioning cables that are spaced from one another across the length of the span of the solar array, and the upper tensioning cables are attached to a primary or main cable. A plurality of spaced primary cables is secured to a continuous extending anchor structure formed adjacent the columns. The anchor structures extend substantially parallel along both of the opposing banks of the body of water. In one example, the anchor structures may include continuous concrete foundations that provide anchoring support for the primary cables. This particular embodiment is conducive for covering smaller bodies of water in which there is a relatively low clearance between the solar array and the surface of the water.

In yet another embodiment of the invention, another type of cable truss assembly can be provided for support in which the panel receivers are mounted in a single convex configuration over the body of water. Each cable truss assembly includes an upper main cable, a lower main cable, and a continuous interconnecting cable that traverses in an alternating fashion diagonally across the span of the solar array. The upper and lower main cables are secured to the upper and lower ends respectively of the opposing support columns. A tensioning device can be used to tension the interconnecting cable across the span. This embodiment is also especially adapted for covering smaller bodies of water in which there is a relatively low clearance between the solar array and the surface of the water.

In accordance with a method of the present invention, a method is provided for assembling the solar panel array across the body water. According to one step in the method, the respective columns and/or column extension supports are constructed, and are securely mounted to the ground adjacent the banks of the body water. According to another step in the method, the cable truss assemblies are assembled in which the first and second support cables are strung between columns on opposite sides of the body of water, and the compression members are secured between the first and second support cables. The first and second support cables are tensioned according to the solar panel and receiver load to be applied to the cables. Once two adjacent cable truss assemblies have been constructed, panel receivers may be installed between and mounted to the cable truss assemblies. In another aspect of the method, it is also contemplated that the cable truss assemblies can be pre-assembled, and therefore installation involves moving each cable truss assembly as a unit to then be secured to the opposing columns on each bank/side of the body of water. The construction of the array can be expedited with the use of watercraft, such as barge type watercraft that include cranes and overhead booms to suspend and hold members of the solar panel array as they are secured to the various cables.

Various other features and advantages of the invention will become apparent from a review of the following detailed description, taken in conjunction with the drawings.

BRIEF DESCRIPTION OF THE DRAWINGS

FIG. 2A is an enlarged fragmentary perspective view of one end of the solar panel array of FIG. 2 to better view details thereof;

FIG. 6 is a bottom plan view of a panel receiver in accordance with an embodiment of the present invention with solar panels mounted to the panel receiver;

FIG. 7 is an enlarged perspective view of the panel receiver of FIG. 6 with the solar panels removed;

DETAILED DESCRIPTION

Figure 1:
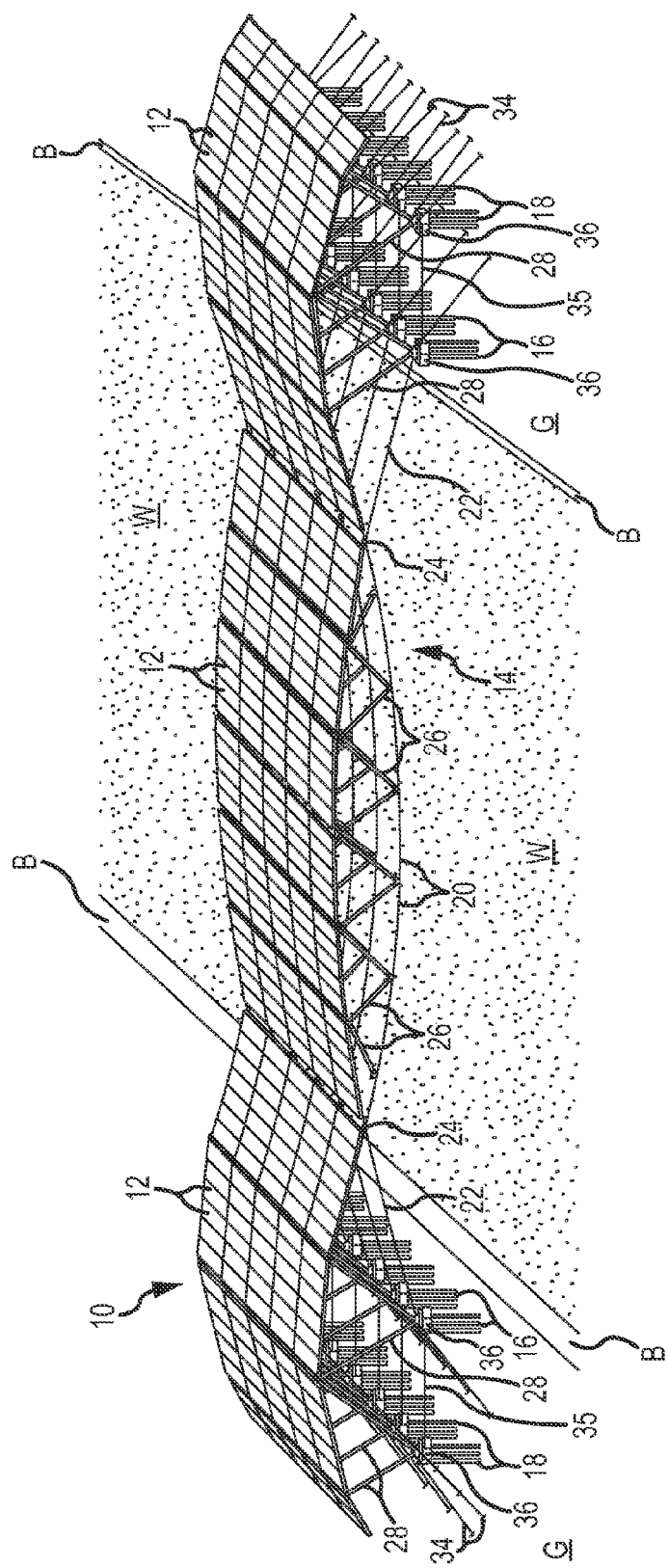
FIG. 1 illustrates a perspective view of a first preferred embodiment of the solar panel array of the present invention.

Referring to FIGS. 1, 2, 2A and 2B, a solar panel array 10 is illustrated in a first embodiment. The array 10 spans a body of water W, such as a canal or aqueduct. The body water W is shown as having two generally parallel extending banks B. Although the solar panel array 10 is especially adapted for installation over long stretches of bodies of water with generally parallel banks, it shall be understood that the array 10 is not limited to any particular configuration for a body of water. A length of the array can be defined as the length that the array extends along opposing banks of the body of water W. A width of the array can be defined as the distance between the banks.

The solar panel array 10 includes primary groups or assemblies including (i) a plurality of solar panels 12, (ii) a plurality of cable truss assemblies 14 that are spaced from one another along a length of the array, and (iii) a plurality of support columns or similar ground mounted structures that support the ends of the cable truss assemblies. The solar panels 12 are mounted to panel receivers 50. In one configuration, the columns may include interior columns 16 with extension support assemblies that provide support to each opposite ends of the cable truss assemblies, and an additional set of exterior columns 18 with extension support assemblies that also provide support to each opposite ends of the cable truss assemblies. The extension support assemblies include a group of rigid support members that extend above the columns including vertically extending extension supports 28 and upper lateral supports 30, as discussed in more detail below.

A span of the truss assemblies means the distance or length that the truss assemblies extend between the support columns, which also corresponds to a direction along the defined width of the array. A lateral or transverse direction or axis means the direction that the cable truss assemblies extend over the body of water, also corresponding to the direction of the span and width of the array. A longitudinal direction means a direction generally perpendicular to the lateral or transverse direction, which also corresponds to a direction along the defined length of the array.

Each cable truss assembly includes a grouping of cables and compression members. As shown, the cable truss assemblies 14 are generally spaced parallel from one another with the groups of cables that are secured to the extension assemblies. More specifically, also referring to FIGS. 2, 2A and 2B, the cable truss assemblies 14 can be described as including a first support cable 20, a second support cable 22, and a plurality of compression members 26 that separate the first and second support cables along a central area of the span. The compression members are arranged in an alternating diagonal pattern to create the general look of a truss. The first support cable 20 for each truss is secured to an upper portion of the column extension assemblies, while the second support cables 22 for each truss is secured to a lower portion of the extension assemblies, or to the upper end of the interior columns 16. Further, the first and second cables are arranged such that there are two crossing points or intersections 24, and the compression members 26 are located between the crossing points 24. The cables 20 and 22 are secured to one another at the respective crossing points 24. The area between the crossing points 24 can be generally characterized as elliptical with pointed or narrowing opposing side edges.

Figure 2:
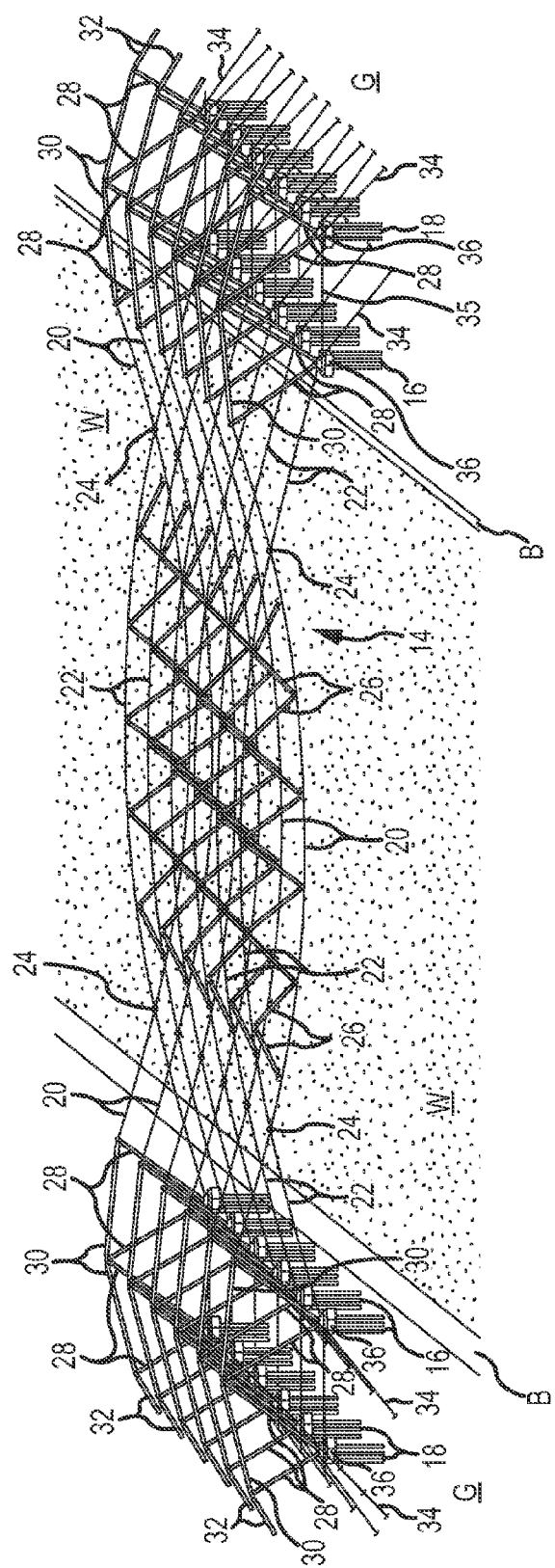
FIG. 2 is another perspective view of the embodiment of FIG. 1, but with the panel receivers and solar panels removed to expose the particular configuration of the cables, columns, supports, and compression members.
Figure 2B:
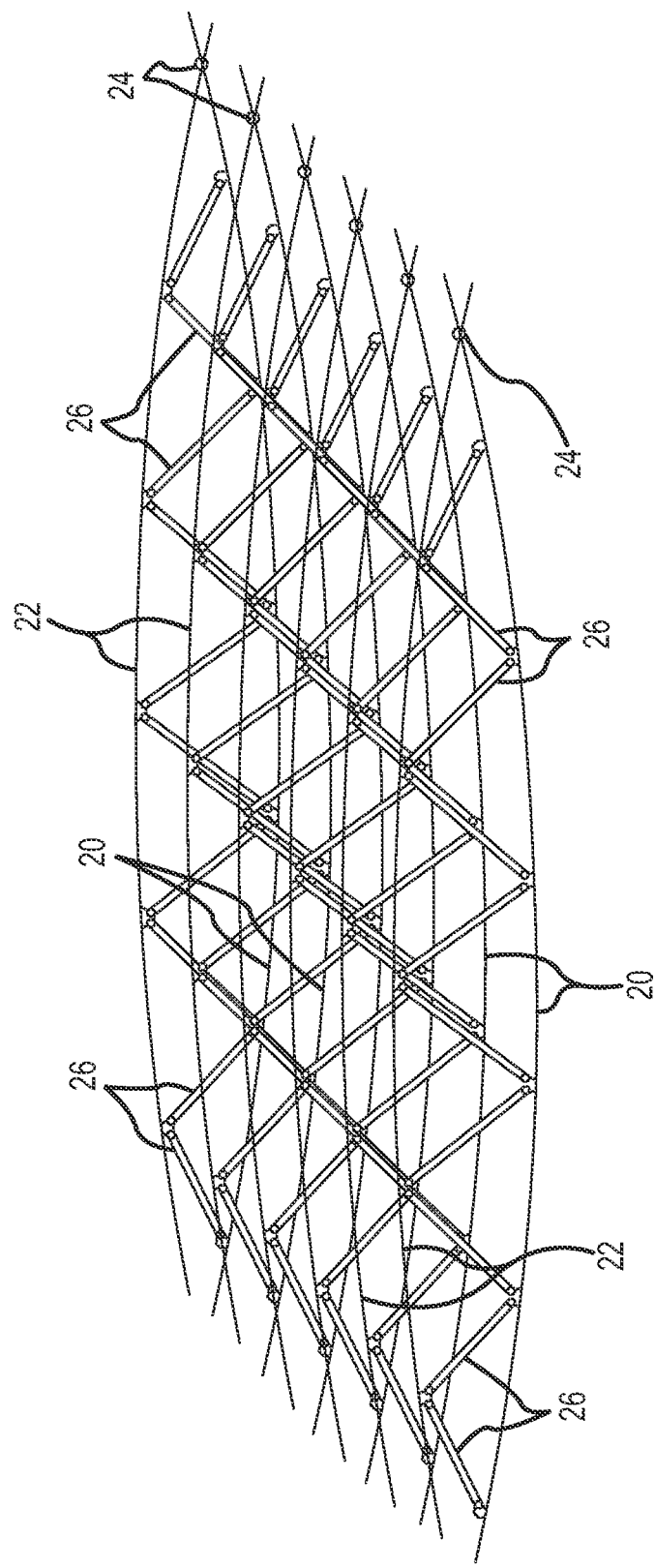
FIG. 2B is an enlarged fragmentary perspective view of the center area of FIG. 2 to better view details thereof.

For the extension support assemblies, each of these includes a pair of vertically extending extension supports 28 that, in the embodiment of FIGS. 1 and 2, are shown as extending upward at an angle forming a generally V-shaped configuration. The upper or free ends of the extension supports 28 are joined by the upper lateral supports 30. Optionally, the span of the array can be increased with additional cantilevered supports 32 that attach to and extend laterally beyond the outermost extension supports 28.

The interior columns 16 and exterior columns 18 are positioned in respective pairs on each side of the body water such that a total of four columns support each cable truss assembly 14. The columns are spaced on the ground G adjacent the banks B, and are preferably mounted with subsurface supports as described below. To provide yet additional stabilization for the array, a plurality of anchor cables 34 can be used as shown in which the cables 34 are secured at one end to the columns with the other end secured to the ground G. Yet additional stabilization can be provided to the array by a plurality of horizontal stabilizing cables 35 that interconnect each interior and exterior pair of columns. Each of the columns may also incorporate enlarged caps 36 that provide a larger mounting surface for the column extension supports 28. The columns 16/18 and column caps 36 can be made of reinforced concrete. The column extension assemblies can be made of aluminum, steel, or other rigid materials of sufficient rigidity and strength. The compression members 26 can also be made of similar rigid materials.

Although the level of the ground G shown as substantially flat, it shall be understood that the array 10 can be installed along banks that may not have the same elevation. In this case, it is possible to modify the lengths of each of the columns and/or heights of the extension support assemblies in order to compensate for differences between bank elevations, or to otherwise account for site specific geography.

Figure 3:
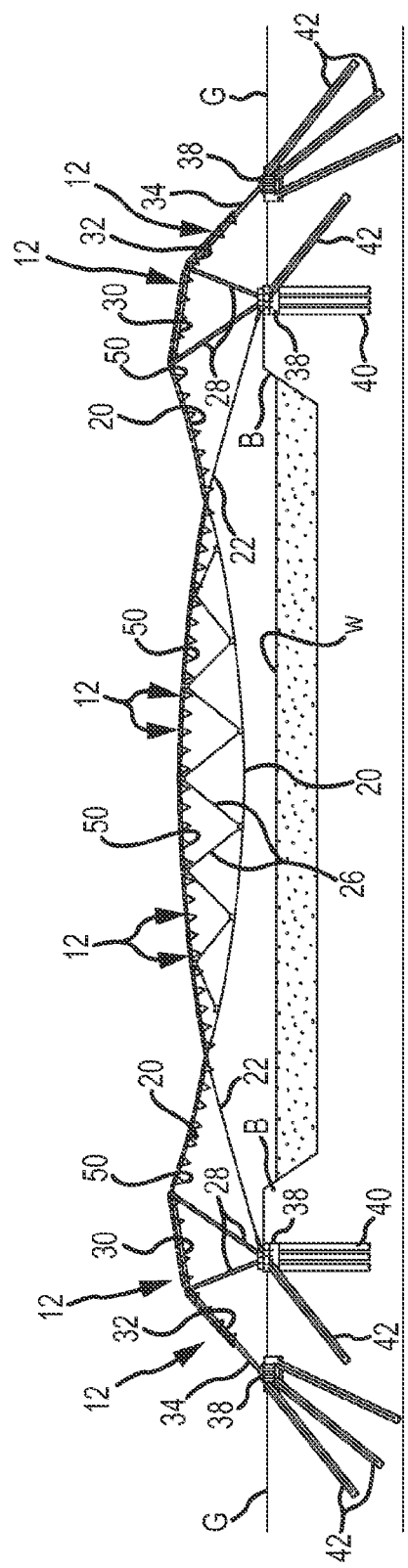
FIG. 3 is a side elevation view of the embodiment of FIG. 1, but with the column extension supports mounted directly to the ground, and therefore the solar panel array not involving use of columns.

Referring to FIG. 3, another embodiment is illustrated, which is similar to the embodiment illustrated in FIGS. 1 and 2, but is modified in that the columns are eliminated in favor of mounting the extension support assemblies closer to the ground upon foundation mounts 38 that extend only a nominal height above the ground as compared to the columns 16 and 18. FIG. 3 also illustrates some sub-surface details for an exemplary foundation design. More specifically, the embodiment of FIG. 3 illustrates extension supports 28 mounted on foundations 38, and the foundations 38 are mounted over respective subsurface piles 40. In order to adequately anchor the anchor cables 34, each of the cables 34 may also be attached to a foundation 38, and the foundation 38 may be mounted over a plurality of soil nails or soil anchors 42. As can be appreciated with a review of the embodiment of FIG. 3, substantial subsurface support can be provided for supporting the array 10 depending upon soil conditions and rock formations that lie adjacent to the banks B of the body of water W. For installations of the solar array that do not require substantial clearance between the water and the array (for example a waterway that does not accommodate travel of watercraft along the body water), the embodiment of FIG. 3 may be preferable since column supports are not required.

Figure 4:
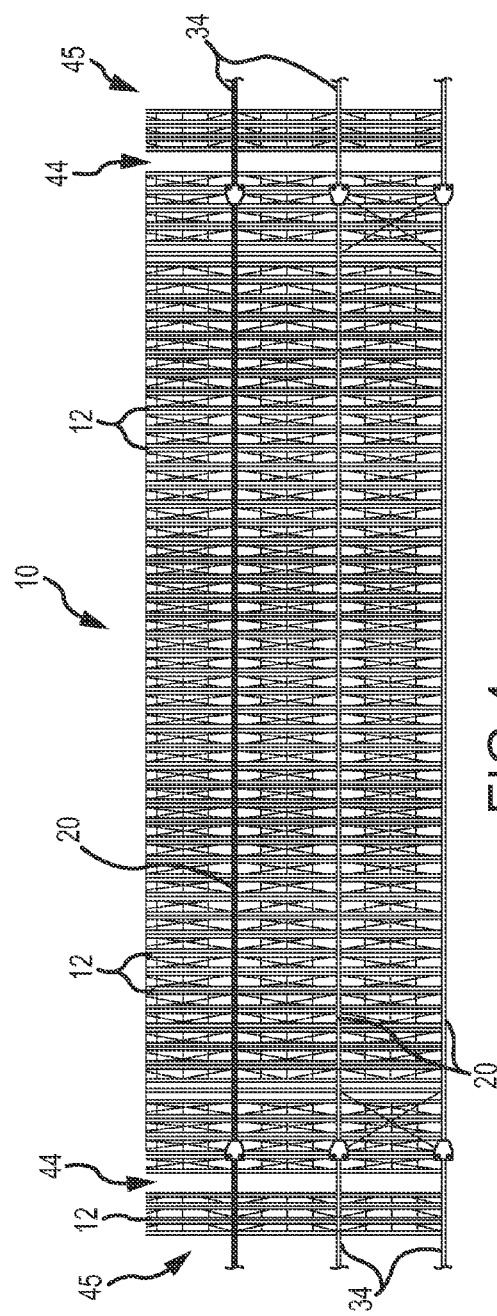
FIG. 4 is a plan view of the embodiment of FIG. 1 showing a general arrangement of the solar panels, along with gaps that may be provided between sets of the panel receivers in order to accommodate design requirements such as air pressure specifications, sunlight requirements, etc.
Figure 5:
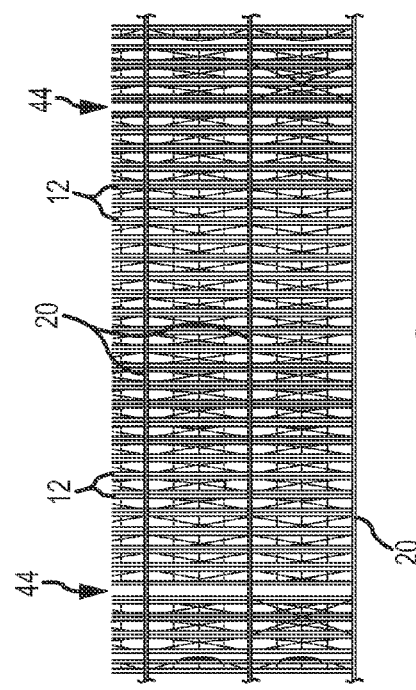
FIG. 5 is another plan view of another embodiment, showing an additional arrangement of the solar panels, and gaps between solar panels.

Referring to FIGS. 4 and 5, plan views are provided that generally illustrate the capability of the array 10 to accommodate a large number of solar panels 12. Referring to FIG. 4, this figure also shows gaps 44 that may be incorporated across the length of the span to achieve various purposes. One purpose for selecting a particular configuration of gaps between solar panels is to control pressure differences that may exist above and below the array during windy conditions. For example, a densely packed group of solar panels with very few gaps between the panels may provide advantages for preventing evaporation, but potentially at the expense of additional forces exerted on the array during windy conditions since airflow can be trapped against the array particularly along long stretches of an array installation. By adopting at least some gaps through the array, differential air pressures may be better controlled. With respect to the groups of solar panels located at each lateral side 45 of the array, it may also be desirable to configure the panels in a downward sloping fashion, such as shown in the FIG. 1, in order to create an airfoil effect that will direct some airflow over the array. By balancing air pressures under and over the array, this helps to prevent damage to the array during high wind conditions since the array adopts an airfoil configuration. Additional considerations for determining a desired density of the solar panels include whether there is a need to provide sunlight for vegetation growing under or adjacent to the columns/foundations. It may be desirable to plant vegetation under the array adjacent the columns/foundations in order to help stabilize the soil in those areas.

FIG. 5 illustrates a smaller exemplary span, yet one that still may incorporate gaps 44 in order to account for wind loads or other loading considerations. In contrast to the embodiment of FIG. 4, a reduced number of solar arrays are located in the center of the array and an increased number are located at each lateral side.

Referring to FIGS. 6 and 7, a particular construction for a panel receiver or pod 50 is illustrated. The panel receiver 50 is used for mounting the solar panels 12. The panel receiver 50 includes a pair of main struts 52 and a plurality of strut stabilizers 54 that interconnect the main struts 52. The main struts 52 extend substantially parallel to one another as shown. The receiver 50 also includes an orthogonal center strut 58 that extends substantially perpendicular from the plane of the main struts and stabilizers. Preferably, the center strut 58 is mounted to a centrally located strut stabilizer 54. The receiver 50 also includes a plurality of strut cables, one cable 56 being secured to each corner of the receiver 50. The panel receivers are preferably made of a lightweight metal, such as aluminum. As shown in FIG. 6, the panels 12 are placed in a single row over the receiver 50. Gaps between each of these solar panels 12 can be specified based upon installation specific requirements. Gaskets or other cushioning elements (not shown) can be used between the panels 12 in order to control solar panel density across an array, and also to provide additional support against loading conditions.

In FIG. 6, a single receiver 50 is shown mounted to the cables 20/22 without adjacent mounted receivers for clarity. In use however, a number of other receivers are mounted adjacent to the receiver shown, and a selected gap or spacing can be provided between each receiver to accommodate design specific requirements (e.g. sunlight, density of panels for required power output, etc.). In order to meet these design requirements and to provide benefits such as reducing evaporative losses, balancing airflow pressures, and providing cushioning for each receiver as well as cushioning between adjacent receivers, gaskets can be used on the solar array. More specifically, a selected gasket pattern can be incorporated on each receiver as well as a gasket pattern between receivers. For example, a gasket material can be placed within selected gaps 57 located between adjacent panels 12 and between the end panels 12 and the cables 20/22. Additionally, gasket material can be placed between selected adjacent receivers along each of the side edges 59 of each receiver. Accordingly, by use of gasket material, gaps in the solar array can be controlled to meet various design requirements.

Figure 8:
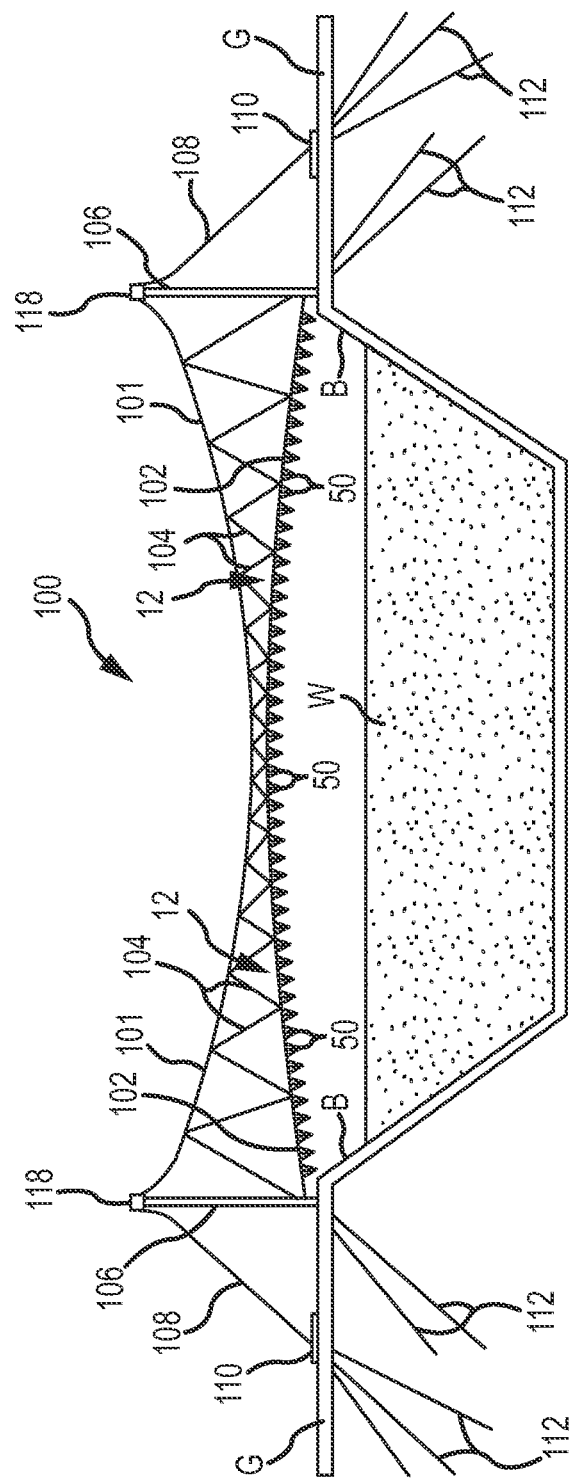
FIG. 8 is a side elevation view of yet another embodiment that incorporates a tensioned cable truss assembly.

Referring to FIG. 8, another preferred embodiment is illustrated with respect to a solar panel array 100 that is especially adapted for installation over a body of water. For this embodiment, in lieu of a cable truss assembly with compression members, support is provided by an arrangement of cables in tension only. The cable support includes an upper main cable 101, a lower main cable 102, and a continuous interconnecting cable 104 that is mounted in an alternating diagonal fashion along the length of the span. The upper main cable 101 has a first generally concave curvature, while the lower main cable 102 has a generally convex curvature when viewed according to the elevation of FIG. 8. Support for the cables is provided by the columns 106 and anchor cables 108. The upper main cable 101 is strung between and secured to the upper ends of the columns 106 which may have column caps 118 with tensioning devices (not shown). The lower main cable 102 is strung between the columns and is secured to the lower end of the columns 106. The panel receivers 12 are mounted to the lower main cables 102 of the array. Support for the cables is provided by the columns 106 and anchor cables 108. FIG. 8 illustrates foundations 110, along with soil nails/anchors 112 for securing the anchor cables 108 in the ground. FIG. 8 also illustrates the use of additional soil nails or soil anchors 112 for anchoring the columns 106. Although soil anchors/nails 112 have been illustrated, other forms of subsurface support can be provided to include piles, etc. The particular embodiment of FIG. 8 is shown as installed with a relatively low clearance between the water and array. Therefore, this type of installation is especially adapted for those bodies of water in which there are no ships or other watercraft which navigate the waterway.

Figure 9:
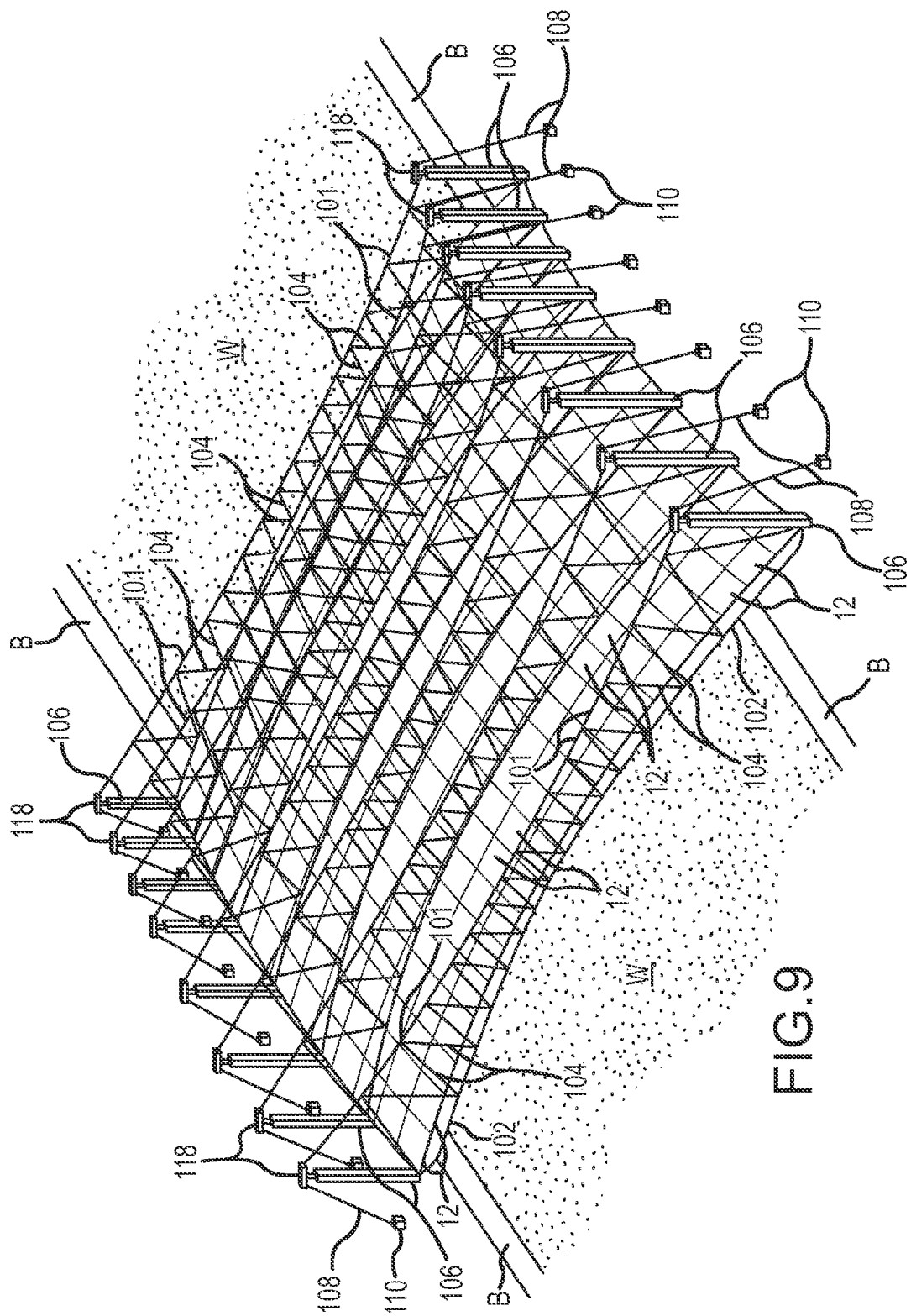
FIG. 9 is a perspective view of the embodiment of FIG. 8.

Referring to FIG. 9, a perspective view is provided for the embodiment of FIG. 8. As shown, the cable groups are spaced from one another along a length of the array. The ends of the span are at an elevation lower than the central area of the span. The naturally convex curvature of the array acts as an airfoil to help prevent lifting of the array from the ground for wind forces that may be directed along the lateral direction of the span. Since the array is mounted relatively close to the ground, a significant amount of airflow will be directed over the array to therefore balance pressure above and below the array during wind conditions. Although not shown, the panel receivers are secured between adjacent pairs of cable groups in the same manner as illustrated with respect to the prior embodiment. Solar panel density for this embodiment may also be adjusted as necessary by providing gaps between panel receivers and groups of solar panels.

Figure 10:
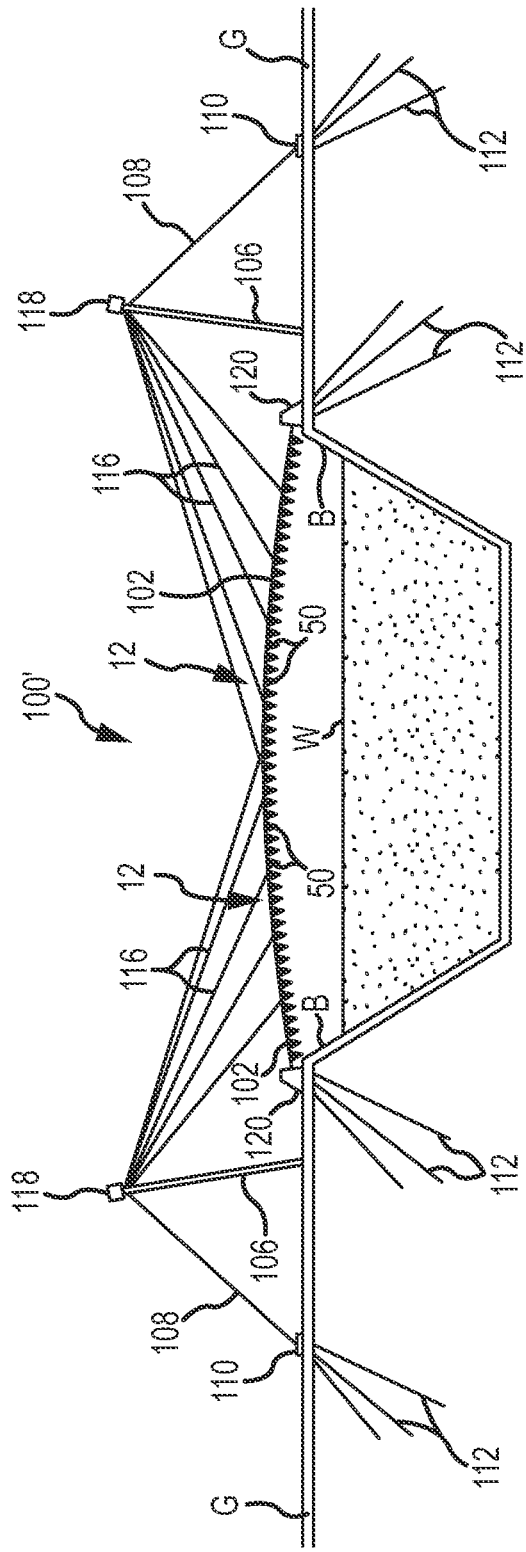
FIG. 10 is a side elevation view of yet another embodiment.
Figure 11:
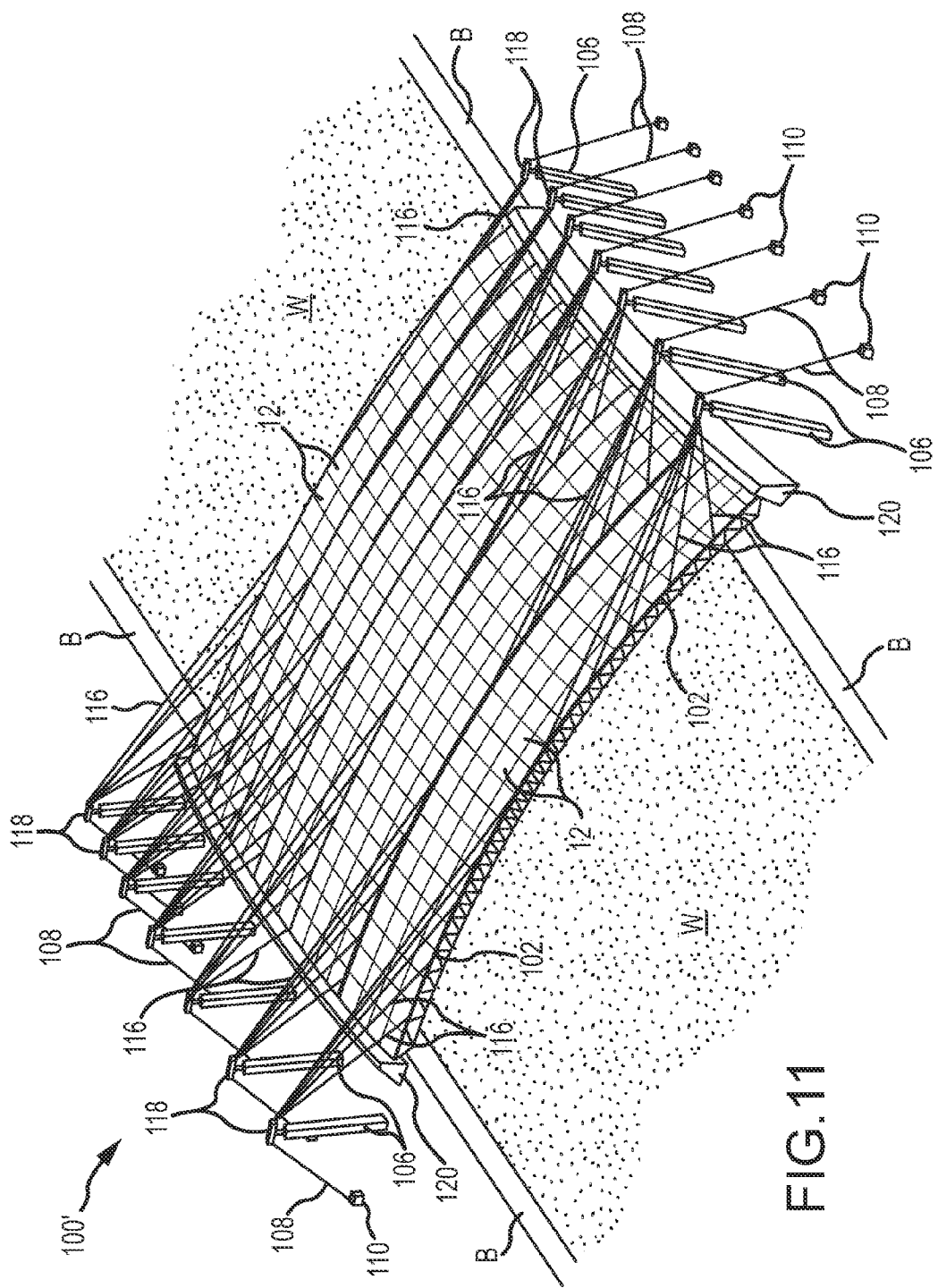
FIG. 11 is a perspective view of the embodiment of FIG. 10.

Referring to FIG. 10, yet another embodiment is illustrated for a solar panel array 100 that spans a body of water. The same reference numbers used in this embodiment correspond to the same structural members as discussed with respect to the embodiment of FIGS. 8 and 9. This embodiment also has a generally convex curvature; however, the cable support structure is different. More specifically, referring to both to FIGS. 10 and 11, the solar array is supported with a plurality of upper tensioning cables 116 that extend from the upper end of each column 106 and connect to spaced locations along each lower main cable 102. Referring to one group of cables 116 extending from a corresponding column, the cables 116 have different lengths and are attached to locations spaced along one lower main cable from a location adjacent the bank B to a location approximately midway along the length of the corresponding span. The opposing column 106 across the span has the same configuration of extending cables 116 in which the cables are attached at a location adjacent the opposing bank B to approximately midway on the span. Therefore, continuous support is provided for each lower cable by the plurality of spaced cables 116. An additional distinction for this embodiment is that the lower main cables 102 are not attached to the columns 106, but rather are secured to main cable foundations 120 that are employed on the ground adjacent the banks B. As shown in FIG. 11, the foundations 120 extend adjacent the banks B and serve as ground type anchors for the cables 102. The foundations 120 may be made of concrete, and may be supplemented with soil nails/piles as necessary to adequately anchor the group of cables 102. The panel receivers 50 are secured to the lower main cables 102 in the same manner shown in FIGS. 6 and 7. Because of the relatively low clearance between the water and the array, this embodiment is also adapted for use with a waterway that does not typically accommodate waterway traffic.

Figure 12:
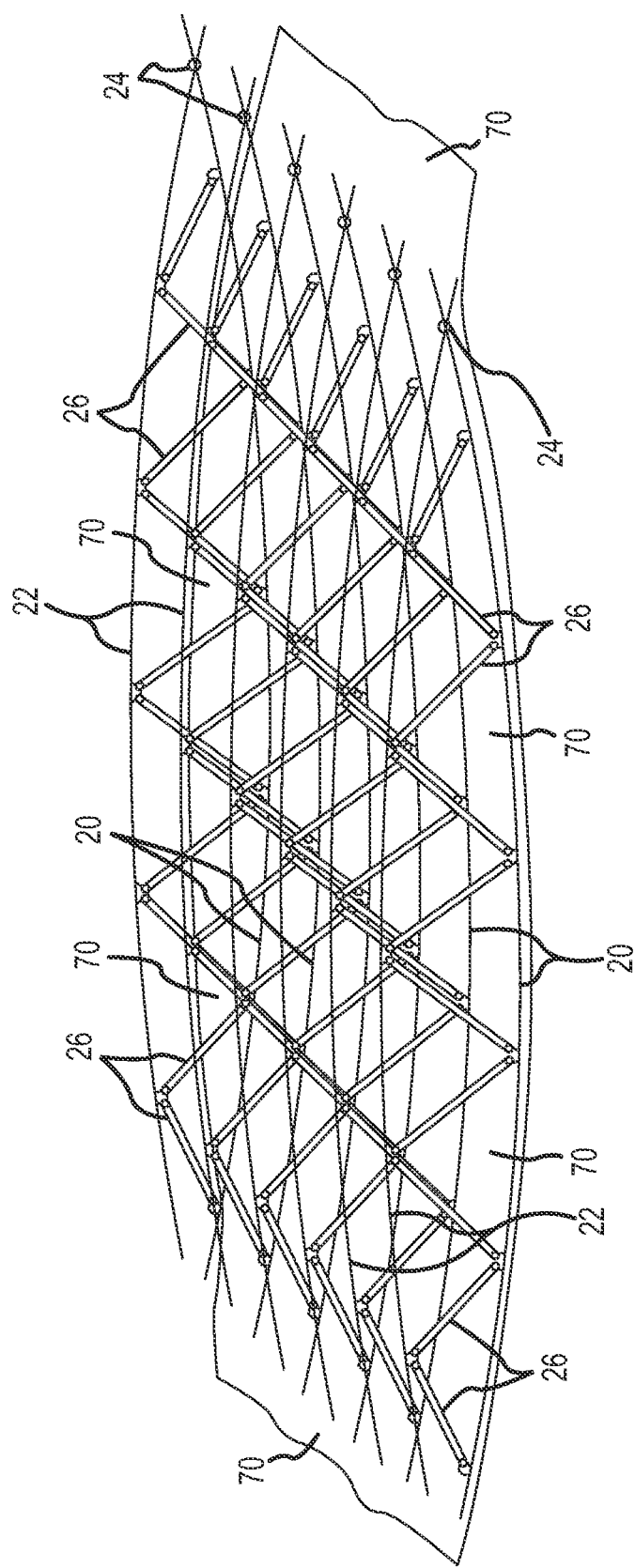
FIG. 12 is an enlarged fragmentary perspective view of the center area of a cable truss assembly, similar to FIG. 2B, showing the addition of a waterproof barrier that can be employed to further reduce evaporative losses.

Referring to FIG. 12, another feature of the invention is illustrated, namely, an evaporative barrier 70 that may be used to reduce evaporation from the underlying body of water. As shown, the evaporative barrier 70 may be suspended by or mounted to the lower group of cables 20. The opposite lateral sides (not shown) of the evaporative barrier 70 may be secured to the interior sets of columns, or may be independently anchored to the ground adjacent the columns. Additionally, it is contemplated that the evaporative barrier may be selectively located at designated areas along the solar array. For example, evaporative losses may already be minimized by the use of gaskets between the sets of solar panels, with the largest uncovered areas of the solar array being located at the opposite lateral sides. Accordingly, it is contemplated that the evaporative barrier could just be mounted along the lateral sides of the solar array and secured to the ground in a manner such that a continuous evaporative barrier is effectively provided with a combination of the evaporative barriers along the lateral sides of the solar array in combination with the solar panels and gaskets. The barrier 70 may be made from a number of acceptable materials to include fabric, plastic, and other natural or synthetic materials.

Figure 13:
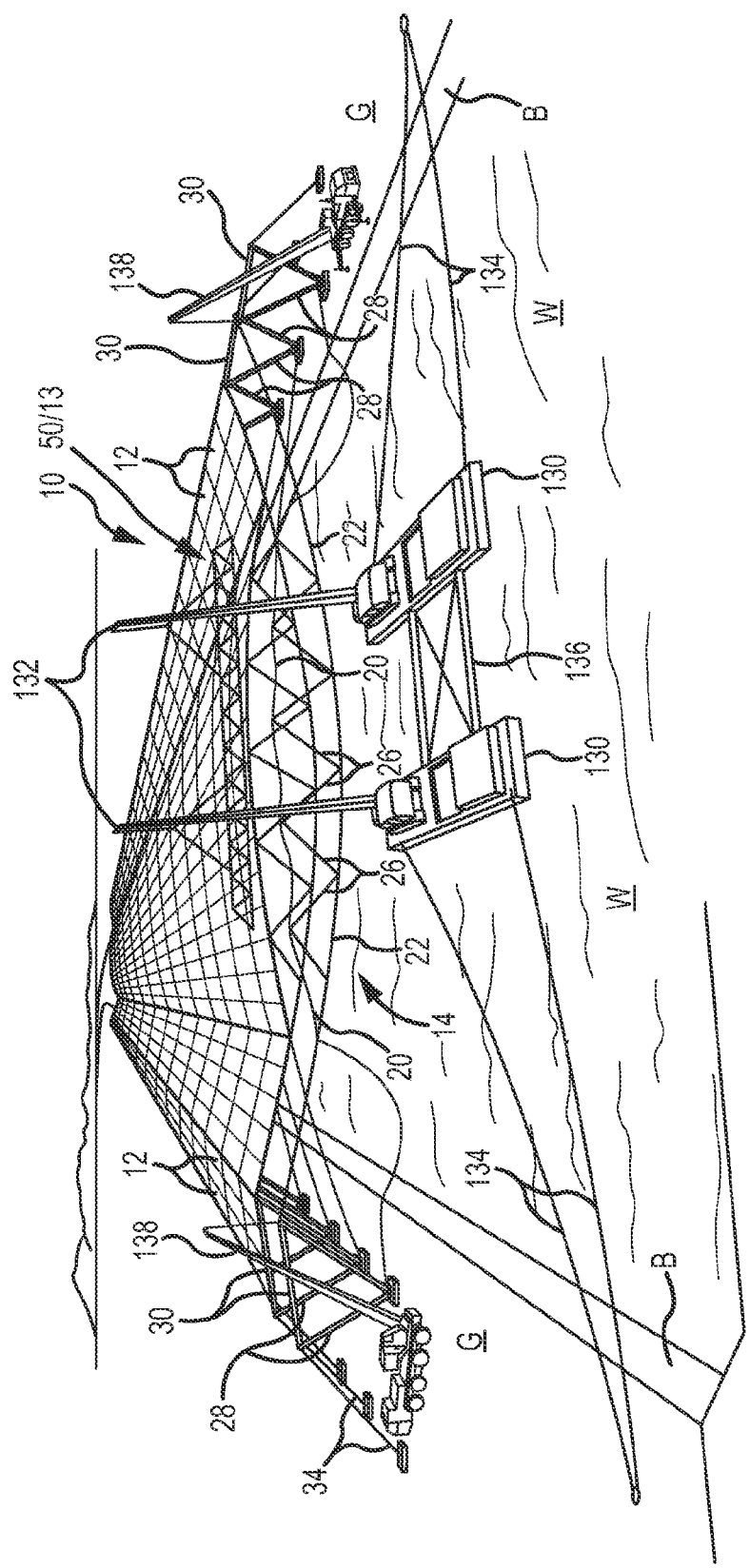
FIG. 13 is a perspective view of one method of constructing the solar panel array, showing the use of watercraft and cranes to install components of the array.

Referring to FIG. 13, a depiction is provided for how the array 10 may be installed with both land equipment and floating equipment. More specifically, FIG. 13 illustrates a solar panel array 10 during construction in which the solar array is being installed along an extended length of a body of water W such as a canal or aqueduct. As shown, the body of water W includes the generally parallel spaced banks B and the array is anchored along each bank. Construction is accommodated by both watercraft 130 and vehicles 138. More specifically, the embodiment shown in FIG. 13 corresponds to the embodiment of FIG. 3 in which extension support assemblies are used for securing and stabilizing cable truss assemblies 14. Land vehicles 138 can be used for many purposes to include assembly of the extension support assemblies, and mounting of the solar panels that are located on land. The watercraft 130 may include barges with cranes and overhead booms 132 that can be used to mount the panel receivers 50 and solar panels 12 between the truss assemblies 14, and to emplace various other components such as the compression members 26. One way in which large interconnected groups of panel receivers and solar panels can be mounted is to incorporate the use of two barges 130 that may handle large sections of the structure simultaneously. As shown, one crane 132 is depicted as supporting an end of the panel receiver/solar panel group 50/12, and the other crane 132 supports the opposite end of the panel receiver/solar panel group 50/12. Other details in the construction depiction include anchor lines 134 used to stabilize positioning of the barges 130, for example to compensate for waterway current which would cause the barges to drift. A connecting frame 136 is shown as a means to stabilize the position between the adjacent barges, as might be necessary for simultaneous handling of a long length of solar panel/panel receivers 50/12. FIG. 13 is provided to represent one method of construction in which a very wide canal can be spanned with the solar array, and construction can be greatly expedited with a combination of both land vehicles and watercraft.

What is claimed is:

1. A solar panel array comprising:
a plurality of panel receivers each having a plurality of solar panels mounted thereto, said solar panel array having a length and a width;
each said panel receiver including a pair of spaced main struts, a plurality of strut stabilizers interconnecting said main struts, a center strut extending substantially perpendicular from said main struts and said strut stabilizers, and a plurality of strut cables, a first end of said strut cables being attached to a distal end of said center strut, and a second opposite end of said strut cables being attached to said main struts or said strut stabilizers;
a plurality of columns positioned at exterior edges of said solar panel array; and
a pair of spaced apart cable truss assemblies for supporting said plurality of panel receivers, each cable truss assembly including a first support cable and a second support cable each extending between respective columns, and a plurality of compression members interconnecting said first and second support cables, said first and second support cables being vertically oriented with one another, said first support cable having a first curvature, and said second cable having a second opposite curvature, said first and second support cables crossing one another and connected to one another along at least one lateral crossing point along a span of said cable truss assembly.

2. An array, as claimed in claim 1, further including:
a plurality of anchor cables connected to and extending from respective columns.

3. An array, as claimed in claim 1, wherein:
said at least one lateral crossing point includes two lateral crossing points, one of said lateral crossing points being located adjacent one lateral side of said cable truss assembly, and the other of said lateral crossing points being located adjacent the opposite lateral side of said cable truss assembly.

4. An array, as claimed in claim 3, wherein:
said compression members interconnect said first and second support cables along a center area of said cable truss assembly between said two lateral crossing points, and said center area between said first and second support cables having a generally elliptical shape.

5. An array, as claimed in claim 4, wherein:
said first and second support cables diverge from one another as the cables extend laterally beyond said two crossing points.

6. An array, as claimed in claim 1, wherein:
said solar panels extending over said solar array are mounted to the array in three convex shaped areas, a first convex area located over a center area, and two lateral convex areas located on opposite lateral sides of said center area.

7. An array, as claimed in claim 1, further including:
an extension support assembly connected to and extending above each column.

8. An array, as claimed in claim 7, wherein:
said extension support assembly includes a plurality of extension supports extending vertically, and an upper lateral support interconnecting upper ends of said extension supports.

9. An array, as claimed in claim 1, further including:
a plurality of cantilevered supports connected to corresponding cable truss assemblies, said cantilevered supports extending laterally beyond said cable truss assemblies for extending a length to which said panel receivers and solar panels may be mounted.

10. An array, as claimed in claim 1, wherein:
each said cable truss assembly includes a plurality of cable truss assemblies spaced from one another longitudinally along the length of the array, said cable truss assemblies extending substantially parallel to one another, said plurality of panel receivers extending between adjacent pairs of said cable truss assemblies.

11. An array, as claimed in claim 1, wherein:
said plurality of columns include a group of interior columns and a group of exterior columns disposed on each opposite lateral side of said array, such that said cable truss assembly is supported at one lateral side by a first pair of interior and exterior columns, and supported on the opposite lateral side by a second pair of interior and exterior columns.

12. An array, as claimed in claim 1, wherein:
said compression members extend in an alternating diagonal pattern laterally across said cable truss assembly.

13. An array, as claimed in claim 1, further including:
an evaporative barrier mounted to the array to minimize evaporative losses.

14. An array, as claimed in claim 13, wherein:
said evaporative barrier includes a waterproof membrane or fabric extending over a selected area under the solar panel array.

15. A method of shading and preventing evaporation of water from a body of water, and simultaneously producing electrical power by a solar panel array constructed over the body of water, said method comprising:
providing a plurality of panel receivers each having a plurality of solar panels mounted thereto, said plurality of panel receivers being arranged in a combination defining the solar panel array having a length and a width;
providing a plurality of columns positioned at exterior edges of said solar panel array and mounted to opposite sides of the body of water;
providing a pair of spaced apart cable truss assemblies for supporting the plurality of panel receivers, each cable truss assembly including a first support cable and a second support cable each extending between respective columns, and a plurality of compression members interconnecting said first and second support cables, said first support cable having a first curvature, and said second cable having a second opposite curvature, said first and second support cables crossing one another and connected to one another along at least one lateral crossing point along a span of the cable truss assembly, wherein said panel receivers are connected to and supported by said first and second support cables;
constructing the solar panel array so that the cable truss assemblies extends over the body of water and is supported on opposite lateral sides by said plurality of columns; and
creating a shaded area under said solar panel array by said panel receives and solar panels.

16. A method, as claimed in claim 15, wherein:
spacing between said panel receivers is adjusted to provide a desired amount of sunlight to pass through said solar panel array.

17. A method, as claimed in claim 15, wherein:
a spacing between said solar panels is adjusted to provide a desired amount of sunlight to pass through said solar panel array.

18. A method, as claimed in claim 15, wherein:
a spacing between said panel receivers is adjusted to provide a desired limitation on evaporation of water from said body of water.

19. A method, as claimed in claim 15, wherein:
spacing between said solar panels is adjusted to provide a desired limitation on evaporation of water from said body of water.

20. A method, as claimed in claim 15 further including:
providing an evaporative barrier mounted to the array to minimize evaporative losses.

21. A method, as claimed in claim 20, wherein:
said evaporative barrier includes a waterproof membrane or fabric extending over a selected area under the solar panel array.

* * * * *